United States Patent [19]
Okamoto et al.

[11] Patent Number: 5,798,702
[45] Date of Patent: Aug. 25, 1998

[54] RESIDUAL BATTERY CAPACITY DISPLAY DEVICE FOR ELECTRIC VEHICLE

[75] Inventors: Yuichi Okamoto; Kenichi Higashi; Masahiko Akashiba; Yoshitaka Ijima; Kazuhiko Matsunami, all of Shizuoka-ken, Japan

[73] Assignee: Suzuki Motor Corporation, Shizuoka-ken, Japan

[21] Appl. No.: 713,510

[22] Filed: Sep. 13, 1996

[30] Foreign Application Priority Data

| Apr. 18, 1996 | [JP] | Japan | 8-121046 |
| Apr. 20, 1996 | [JP] | Japan | 8-122738 |
| Jun. 27, 1996 | [JP] | Japan | 8-186616 |

[51] Int. Cl.$^6$ ............................. B62J 3/00; G08B 21/00
[52] U.S. Cl. ................. 340/636; 340/432; 340/691; 340/693; 180/220; 320/48; 324/433; 324/435
[58] Field of Search ............................. 340/432, 636, 340/691–693; 324/433, 435; 320/48; 180/220

[56] References Cited

U.S. PATENT DOCUMENTS

| 4,871,042 | 10/1989 | Hsu et al. | 180/220 |
| 5,222,572 | 6/1993 | Yamagiwa et al. | 180/220 |
| 5,293,156 | 3/1994 | Shoji et al. | 340/636 |
| 5,316,101 | 5/1994 | Gannon | 180/220 |
| 5,368,122 | 11/1994 | Chou | 180/220 |

Primary Examiner—Jeffery Hofsass
Assistant Examiner—Daniel J. Wu
Attorney, Agent, or Firm—Flynn, Thiel, Boutell & Tanis, P.C.

[57] ABSTRACT

An improved battery residual capacity meter or display device which is positioned on an electrically-assisted bicycle so as to enhance the visibility thereof. In addition, the battery residual capacity meter can measure residual battery capacity even when an electric motor associated with the bicycle is stopped. In one embodiment, the residual battery capacity meter includes a display unit having a plurality of lamps, a residual capacity measurement unit for measuring the residual battery capacity based on a voltage of a battery associated with the bicycle, and a display controller for controlling the illumination and flashing of the lamps so as to indicate a particular residual battery capacity measured by the residual capacity measurement unit. Further, the residual capacity measurement unit includes a drive mode measurement module for continuously measuring the residual battery capacity while the electric motor is operated in a drive mode, and a stop mode measurement module for measuring residual battery capacity after a predetermined time elapses from the moment the electric motor is stopped.

9 Claims, 19 Drawing Sheets

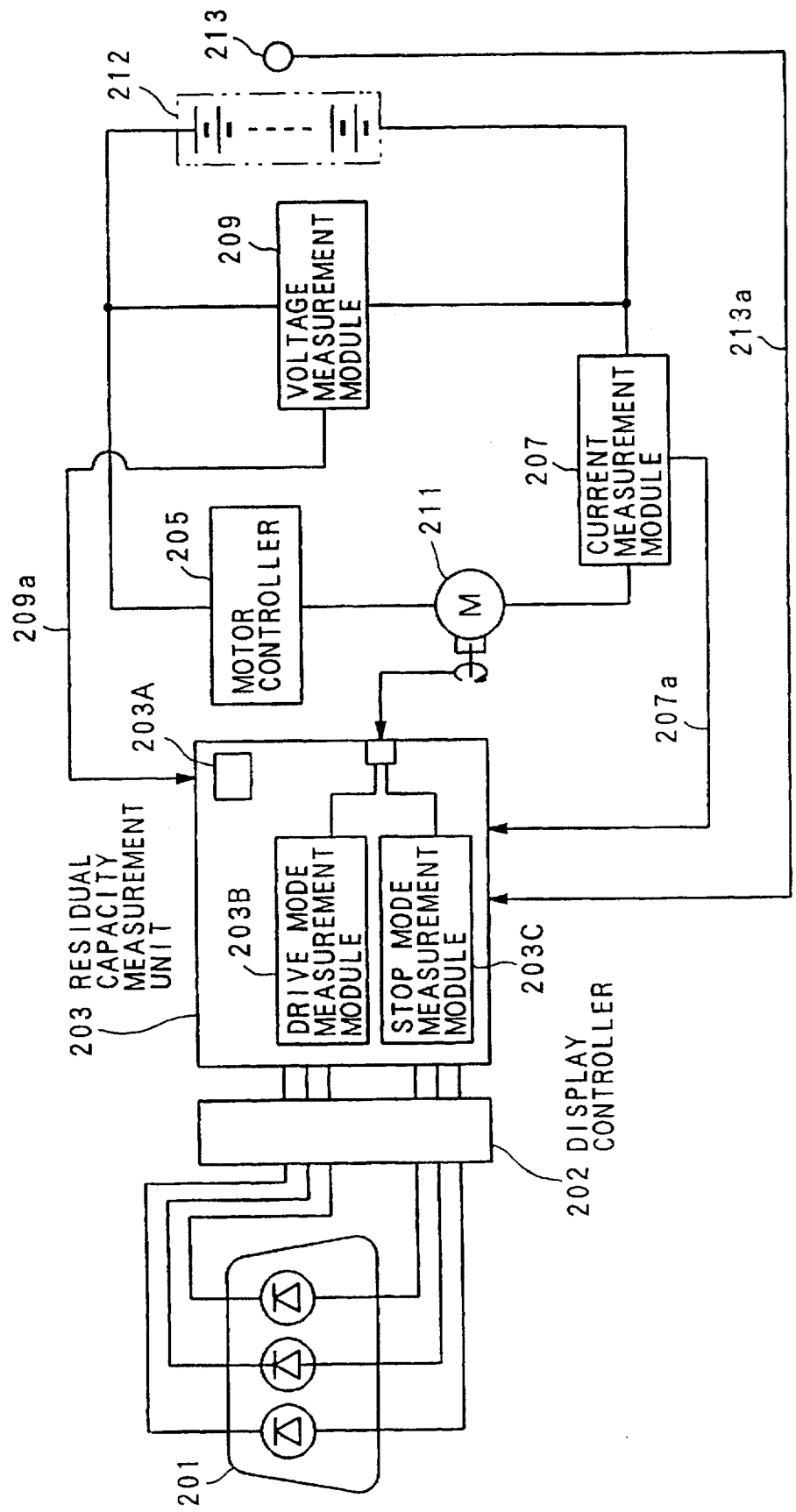

| LAMP (S) | | | BATTERY CAPACITY (%) 100　　50　　0 | COMMENT |
|---|---|---|---|---|
| 201a | 201b | 201c | | |
| ☀ | ☀ | ○ | ▭ (100-50) | CAN START AND RUN |
| ○ | ☀ | ○ | ▭ (around 50) | BETTER NOT GO TOO FAR |
| ○ | ○ | ☼ | ▭ (low) | BETTER CHARGE BATTERY |
| ○ | ○ | ☀ | ▯ (0) | BATTERY SPENT OUT. PLEASE CHARGE |

[ ☀ : ILLUMINATED, ☼ : FLASHING, ○ : NOT ILLUMINATED ]

RESIDUAL CAPACITY CONVERSION TABLE

RESIDUAL CAPACITY CONVERSION TABLE (RATED VOLTAGE: 30.0V)

| USABLE CAPACITY | RESIDUAL CAPACITY | DISPLAY | | | REMARK |
|---|---|---|---|---|---|
| OVER 60% | OVER 64% | GREEN ☀ | GREEN ☀ | RED ○ | LIGHTING |
| 25%~60% | 32.5%~64% | GREEN ○ | GREEN ☀ | RED ○ | LIGHTING |
| BELOW 25% | 10%~32.5% | GREEN ○ | GREEN ○ | RED ☀ | FLICKERING |
| 0% | BELOW 10% OR POWER (OR BATTERY) FAILURE | GREEN ○ | GREEN ○ | RED ☀ | LIGHTING |

(BATTERY TEMPERATURE: EQUIVALENT TO 10°C)

| MOTOR CURRENT [AMPERES] | | 0 | 5 | 10 | 15 | 20 |
|---|---|---|---|---|---|---|
| BATTERY RESIDUAL CAPACITY [VOLTS] | 64% BELOW | 30.5V | 29.5V | 28.5V | 27.7V | 26.9V |
| | 32.5% BELOW | 29.5V | 28.1V | 27.1V | 26.1V | 25.5V |
| | 10% BELOW | 28.3V | 26.7V | 25.5V | 24.3V | 23.3V |

FIG. 24

| FAILURE SYSTEM | FAILURE CONTENT | CODE |
|---|---|---|
| BATTERY | HARNESS DISCONNECTION CONNECTION LOOSE CONTACT FAIL-SAFE RELAY IMPERFECT CONTACT | 1 (001) ILLUMINATED |
| TORQUE SENSOR | HARNESS DISCONNECTION·SHORT CONNECTION LOOSE CONTACT SENSOR CHARACTERISTIC DEFECT | 2 (010) FLASHING |
| ROTARY SENSOR | HARNESS DISCONNECTION·SHORT CONNECTION LOOSE CONTACT ROTARY SENSOR MALFUNCTION | 3 (011) FLASHING |
| TORQUE SENSOR | HARNESS DISCONNECTION·SHORT CONNECTION LOOSE CONTACT MOTOR DISCONNECTION (TRANSISTOR OPEN) | 4 (100) FLASHING |
| CONTROLLER | TRANSISTOR SHORT FAIL-SAFE RELAY CONTACT WELDING CPU MALFUNCTION OSCILLATOR MALFUNCTION | 5 (101) NOT ILLUMINATED |

| FRILURE DIAGNOSIS CODE | DISPLAY | | |
|---|---|---|---|
| DIAGNOSIS CODE: 3<br>BINARY NUMBER (011) | GREEN<br>○ | GREEN<br>☀ | RED<br>☀ |
| DIAGNOSIS CODE: 5<br>BINARY NUMBER (101) | GREEN<br>☀ | GREEN<br>○ | RED<br>☀ |

RESIDUAL BATTERY CAPACITY DISPLAY DEVICE FOR ELECTRIC VEHICLE

FIELD OF THE INVENTION

The present invention relates generally to a residual battery capacity meter or display device for an electrically assisted vehicle, and more particularly to a residual battery capacity meter that is attached to an electrically assisted vehicle so as to provide good visibility of the residual battery capacity meter to an operator. The present invention also relates to a residual battery capacity meter that measures or otherwise determines the residual capacity of a battery which supplies electric power to an electric motor of the electrically assisted vehicle. The residual battery capacity meter not only displays residual battery capacity, but also the occurrences of system failures. Electrically-assisted or auxiliary-powered vehicles include electrically-assisted bicycles, electric vehicles, electric wheelchairs, and the like. The technique for displaying failures on the residual battery capacity meter may also be applied to industrial equipment that is provided with failure diagnosis capabilities such as automobiles and autobicycles.

BACKGROUND OF THE INVENTION

Auxiliary powered bicycles having an electric motor operating in correspondence with manually driven pedals are known. Typically, the driving force of the electric motor is used as auxiliary power. The electric motor is subject to control by an electronic control unit (ECU) or controller in which various circuits are incorporated.

In conventional auxiliary powered bicycles, a residual capacity of a battery is indicated by means of illuminating a lamp on a residual battery capacity meter when a residual capacity of the battery drops below a specific value (a specific capacity). The specific value is usually set to a comparably low level.

Consequently, before operating an auxiliary powered bicycle, even if a residual capacity of a battery is so low as to be close to the specific value and not to be indicated on the residual battery capacity meter, the residual capacity of the battery is not indicated. If the bicycle is operated in the foregoing state, the residual capacity of the battery may drop below the specific value during operation, as indicated on the residual battery capacity meter, which causes the battery to be drained or otherwise discharged leading to a disadvantage and inconvenience in a practical use.

The known residual battery capacity meter is set so as to indicate the residual capacity of a battery by illuminating a lamp when the residual capacity drops to a comparably low level. If the residual capacity of the battery exceeds the specific value during normal operation, a failure of the residual battery capacity meter or of the battery itself will not be immediately detected, thus leading to an inconvenience in handling. Further, a residual battery capacity meter is generally mounted to the right or left of where a head pipe and a main pipe of a bicycle frame are joined, or on either side of the main pipe. As a result, the handle bars are typically an obstacle to viewing the residual battery capacity meter, depending on the mounting position thereof.

Conventionally, a residual battery capacity meter for an electric vehicle is equipped with one residual capacity display lamp (red). The lamp indicates that a residual capacity of a battery is sufficient when the lamp is not illuminated, and indicates that the residual capacity of the battery is low when the lamp is illuminated or is repetitively flashed on and off. However, in the conventional example, a single lamp is limited in the amount of information conveyed, i.e. the single lamp may indicate that the residual capacity of a battery is either above or below a predetermined limit such as 5%. Therefore, it is impossible to know just how much the battery is charged from a single lamp, which is inconvenient to the driver.

In addition, the battery power consumption rate varies depending on a load applied to the electric vehicle during operation thereof. In a conventional residual battery capacity meter, it is difficult to inform the operator of the change in power consumption depending on the load. Further, in the conventional residual battery capacity meter, the residual capacity of the battery is measured by a correlation among current and battery voltage and residual battery capacity. However, while the electric motor is stopped, the current is zero (0) and an accurate correct measurement of the residual battery capacity based on the voltage alone is difficult.

Conventionally, in an auxiliary powered bicycle provided with a failure diagnosis function, a result of a diagnosed failure is displayed using one lamp such that the cycle or frequency of illumination of the lamp corresponds to the failure diagnosed, as shown in FIG. 28. In particular, a repeated double flashing of the lamp indicates the failure of a torque sensor. A slower single flash of the lamp indicates the failure of a speed sensor. Further, some automobiles diagnose failures using a failure diagnosis unit 52 which communicates with a built-in computer 51 to display the type of failure diagnosed, as shown in FIG. 29.

However, in the conventional example, to discriminate diagnosed failures from various cycles or frequencies of flashing by a single lamp is difficult, particularly for bicycle shops dealing with electrically assisted bicycles. In addition, it is difficult for each bicycle shop to have expensive failure diagnosis equipment available to diagnose failures.

The present invention has been made in view of the foregoing disadvantages in a bicycle which uses the driving force created by an electric motor as auxiliary power to assist an operator in driving a pedal crankshaft of the bicycle. It is therefore an object of the present invention to provide a residual battery capacity display device for an electric vehicle that can correctly measure the residual battery capacity even while an electric motor is stopped.

It is also an object of the present invention to provide a display device for an electrically assisted vehicle wherein residual battery capacity and failure diagnosis are displayed on a residual battery capacity meter so as to be easily understood by operators and service personnel.

A first aspect of the present invention discloses a bicycle having an electric motor which provides auxiliary power for driving the bicycle in conjunction with a pedal effort provided by an operator. The bicycle includes a frame having a head pipe communicating with a front wheel of the bicycle, a seat pipe communicating with a saddle, a main pipe communicating with the head pipe and the seat pipe, and seat and chain stays communicating with a rear wheel of the bicycle from the main pipe, a frame cover secured to the main pipe and having a recess for receiving a battery unit, and a residual battery capacity meter for indicating a residual capacity of the battery unit. The residual battery capacity meter is centrally mounted on the frame cover at a position between the head pipe and the recess so as to provide good visibility of the residual battery capacity meter and to facilitate handling of the bicycle.

According to another aspect of the present invention, a residual battery capacity display device mounted to an electrically-assisted bicycle which is driven by an electric motor in conjunction with a pedal effort provided by an operator is disclosed. The residual battery capacity display device includes a display unit having a plurality of lamps, a residual capacity measurement unit for measuring a residual battery capacity based on a voltage of a battery associated with the bicycle, and a display controller for controlling an illumination and flashing of the plurality of lamps in correspondence with the residual battery capacity measured by the residual capacity measurement unit. The residual capacity measurement unit includes a drive mode measurement module for continuously measuring the residual battery capacity while electric motor is operated, and a stop mode measurement module for measuring the residual battery capacity after a predetermined time period elapses after the electric motor is stopped.

Since the display device can measure residual battery capacity while the electric motor is stopped, there is provided two different routines for measuring residual battery capacity depending upon whether the electric motor is operating or not. Furthermore, when the electric motor is stopped, residual battery capacity is measured only after a certain period of time (for example, 5 seconds) elapses from the moment the electric motor is stopped so that a stable measurement can be performed regardless of whether a voltage variation, dependent on drive current level prior to stopping the electric motor, is large or not.

According to yet another aspect of the present invention, a display device for an electrically assisted bicycle which is selectively driven by an electric motor in conjunction with a pedal effort provided by an operator, is provided. The display device includes a residual battery capacity calculation unit for calculating a present residual battery capacity value based on a battery voltage and a drive current of the electric motor, a residual capacity display pattern specifying unit for specifying a residual capacity display pattern based on the present residual battery capacity value calculated by the residual battery capacity calculation unit, and a display unit for displaying the present residual battery capacity value based on the residual capacity display pattern specified by the residual capacity display pattern specifying unit. The residual battery capacity calculation unit includes a previous residual capacity measurement module which causes a previously measured residual battery capacity value to be displayed by the display unit when the present residual battery capacity value is greater than the previously measured residual battery capacity value.

The display unit includes a number of lamps for displaying a residual capacity display pattern by selectively illuminating and flashing various combinations of the lamps. As a battery voltage recovers after the electric motor is stopped, the residual battery capacity values increase. Thus, the display device includes a module for displaying a previously measured residual battery capacity when a present residual battery capacity value is greater than a previously measured residual battery capacity value.

In addition, the display device further includes a failure monitor for detecting a component failure, a failure display pattern specifying unit for specifying a failure display pattern based on the component failure detected by the failure monitor, and a failure display controller for causing the failure display pattern to be displayed on the display unit instead of the residual battery capacity display.

Other objects and purposes of the present invention will be apparent to persons familiar with structures of this general type upon reading the following specification and inspecting the accompanying drawings.

BRIEF DESCRIPTION OF THE DRAWINGS

FIG. 11 is a block diagram showing another embodiment of a residual battery capacity meter according to the present invention;

FIG. 24 is a chart showing the relationship between various system failures and an associated failure diagnosis code;

DETAILED DESCRIPTION

Figure 1:
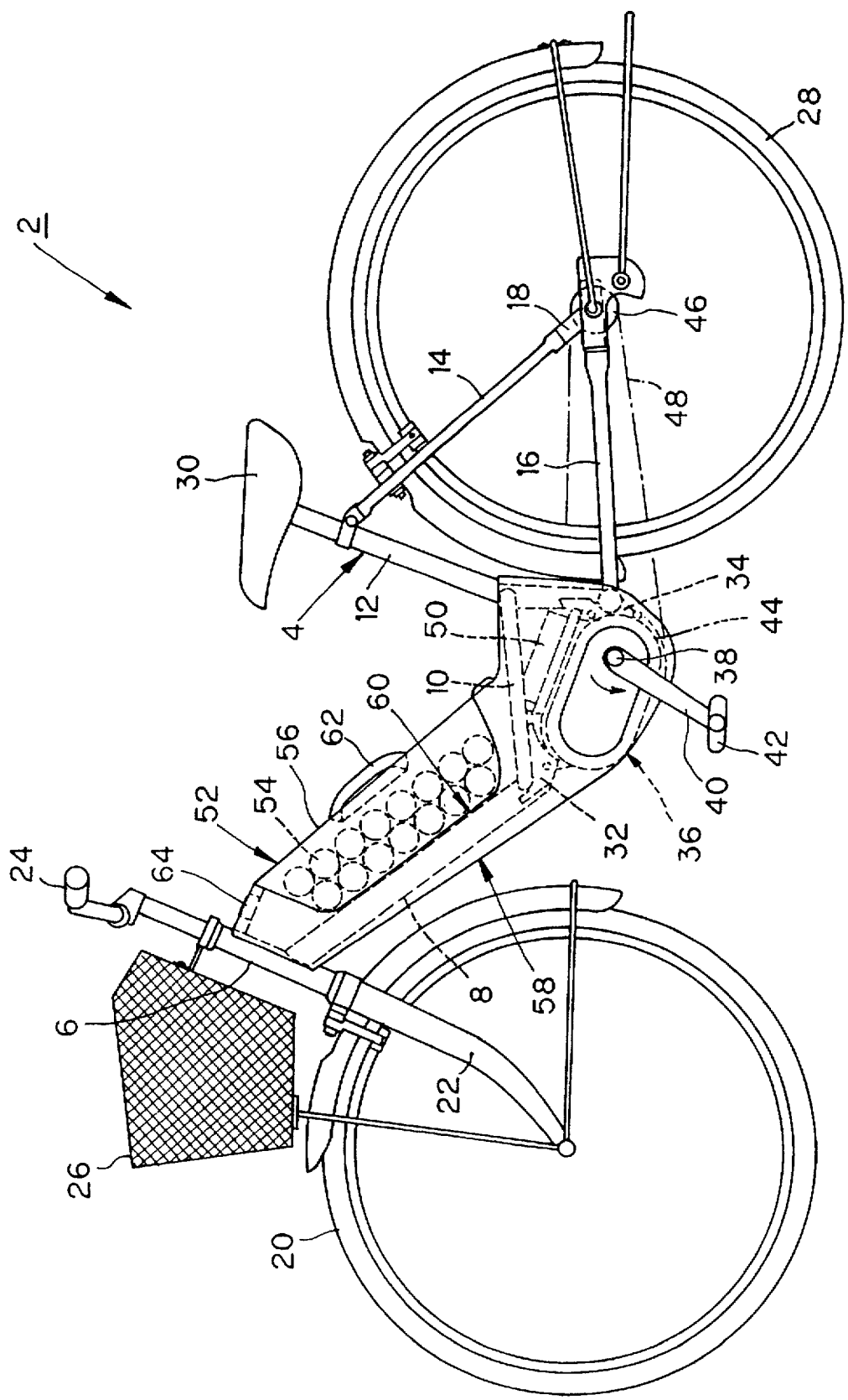
FIG. 1 is a right side view of a bicycle illustrating one embodiment of the present invention.

FIGS. 1 to 10 illustrate an embodiment of the present invention. In FIG. 1, there is shown an auxiliary powered vehicle, i.e. a bicycle 2. A frame 4 of the bicycle 2 is constructed such that a main pipe 8 slants downward to the rear from a head pipe 6 located on a front portion of the bicycle 2. A pair of right and left bridge pipes 10 extend virtually horizontally to the rear from a lower portion of the main pipe 8, and are connected to an intermediate part of an upwardly extending seat pipe 12. A pair of right and left seat stays 14 slant downwardly and rearwardly from an upper end of the seat pipe 12. A pair of right and left chain stays 16 extend rearwardly from a lower portion of the seat pipe 12, and are joined to a rear end plate 18.

The head pipe 6 rotatably supports a front fork 22 which supports a front wheel 20, a handle bar 24, and a basket 26. A rear wheel 28 is rotatably supported on the rear end plate 18 of the frame 4. Further, a saddle 30 is attached to an upper portion of the seat pipe 12.

An auxiliary driving unit 36 is mounted between a first hanging plate 32 attached to a lower portion of the main pipe 8 and the bridge pipes 10, and a second hanging plate 34 attached on a lower portion of the seat pipe 12. The auxiliary driving unit 36 serves as an auxiliary member of frame 4, and includes a source of auxiliary power such as an electric motor (not shown), as well as a crankshaft 38. Cranks 40 are fixed on both ends of the crankshaft 38, and pedals 42 are attached to the ends of the cranks 40. A drive sprocket 44 is positioned on the right side of the auxiliary driving unit 36, and is mounted on the crankshaft 38. A chain 48 is wound around the drive sprocket 44 and a driven sprocket 46 attached to a rotary shaft of the rear wheel 28.

The crankshaft 38 may be manually rotated using an operator's feet and legs in a known manner. A resultant force unit (not shown) within the auxiliary driving unit 36 combines the rotating force manually applied to the crankshaft 38 by the operator and the auxiliary driving force applied by an output shaft of the electric motor into an output force for driving the drive sprocket 44. The drive sprocket 44 rotates in the same direction as the crankshaft 38, and the rotation is transmitted via the chain 48 to the driven sprocket 46, thereby driving the rear wheel 28. A control unit 50 for regulating the output of the electric motor is provided on an upper portion of the auxiliary driving unit 36.

A battery unit 52 serves as a power supply or source of power for driving the electric motor. The battery unit 52 is mounted on the frame 4 and is positioned so as to extend along the main pipe 8. The battery unit 52 includes a number of batteries 54 which are sealed within a synthetic resin battery case 56.

A frame cover 58 made of a synthetic resin covers a substantial portion of the main pipe 8 to approximately the auxiliary driving unit 36 in order to enhance the cosmetic appearance of the bicycle 2. In the frame cover 58, a battery containing recess 60 is formed which extends downwardly in a longitudinal direction along the main pipe 8. The battery unit 52 fits into the battery containing recess 60.

The battery unit 52 is detachable from the frame 4 so that the battery unit 52 can be recharged by detaching the battery unit 52 from the frame 4 when charging is needed. A carrying handle 62 is provided on top of the battery unit 52, which is located on an upper portion of the battery unit 52 proximate a center of gravity thereof. The battery unit 52 may be installed so as to pivot around a pivot member (not shown) associated with the main pipe 8. After positioned to a specific angle, the battery unit 52 can be moved rearwardly to release the battery unit 52 from the pivot member.

An electronic control unit (ECU) or controller 50 is mounted on the bicycle 2 and controls the driving force of the electric motor in correspondence with the pedal effort provided by the operator. A main switch (not shown) is provided for selectively turning on and off the power supplied from the batteries 54 of the battery unit 52. The control unit 50 includes a power supply circuit (not shown) connected to the batteries 54 of the battery unit 52 via the main switch, and a controller (CPU) (not shown) connected to the power supply circuit. The control unit 50 also includes a pedal rotation input circuit (not shown) for sending a signal received from a pedal sensor (not shown) which detects the speed of pedal rotation, to the controller, and includes a pedal effort input circuit (not shown) for sending a signal received from a pedal effort sensor (not shown) which detects pedal effort, to the controller. The control circuit 50 further includes a motor driving circuit (not shown) connected to the controller for driving the electric motor, and includes a current detecting circuit (not shown) connected to the motor driving circuit and the controller.

The controller of the control unit 50 inputs a first signal from the pedal rotation input circuit, which first signal is received from the pedal sensor, and inputs a second signal from the pedal effort input circuit, which second signal is received from the pedal effort sensor. The controller processes the input first and second signals, and outputs a third signal to the motor driving circuit which, in turn, generates a motor driving signal for controlling the output of the electric motor.

Figure 2:
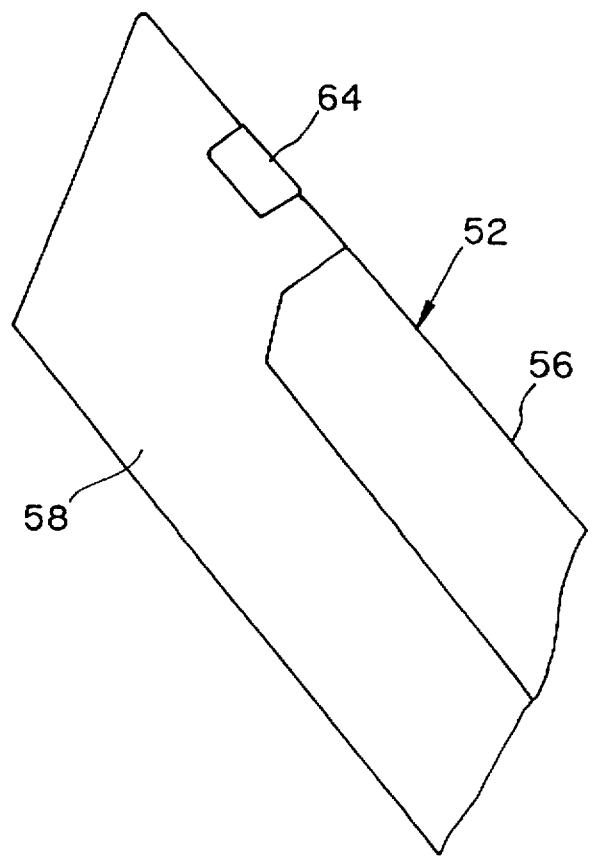
FIG. 2 is an enlarged schematic illustration of a residual battery capacity meter mounted on a frame of the bicycle.
Figure 3:
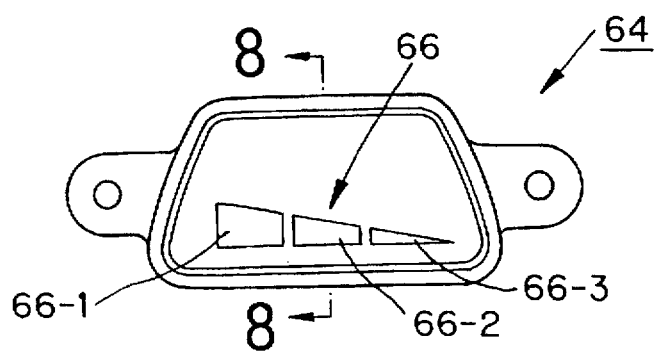
FIG. 3 is a front view of the residual battery capacity meter.
Figure 4:
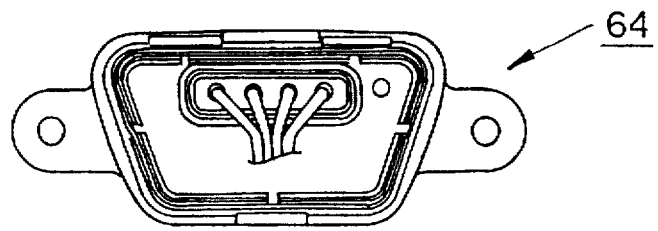
FIG. 4 is a rear view of the residual battery capacity meter.
Figure 5:
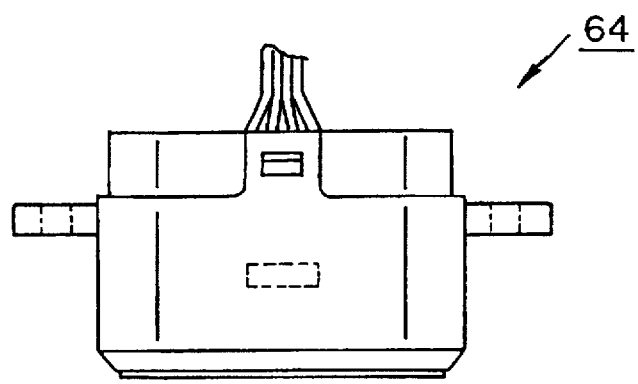
FIG. 5 is a top view of the residual battery capacity meter.
Figure 6:
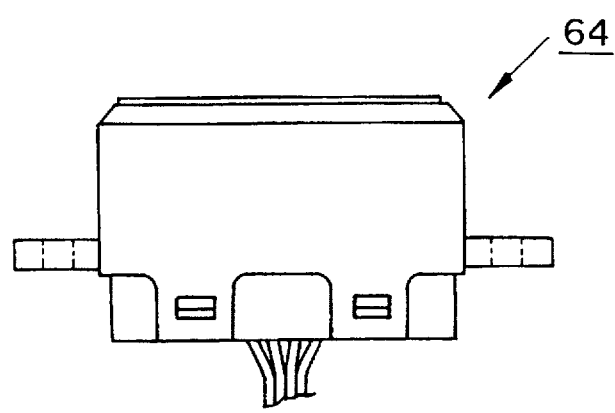
FIG. 6 is a bottom view of the residual battery capacity meter.
Figure 7:
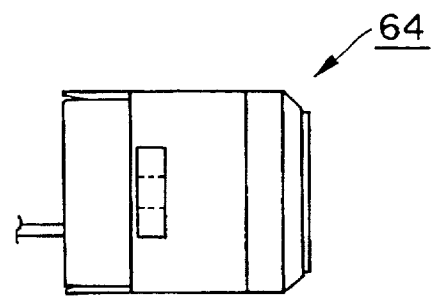
FIG. 7 is a left side view of the residual battery capacity meter.
Figure 8:
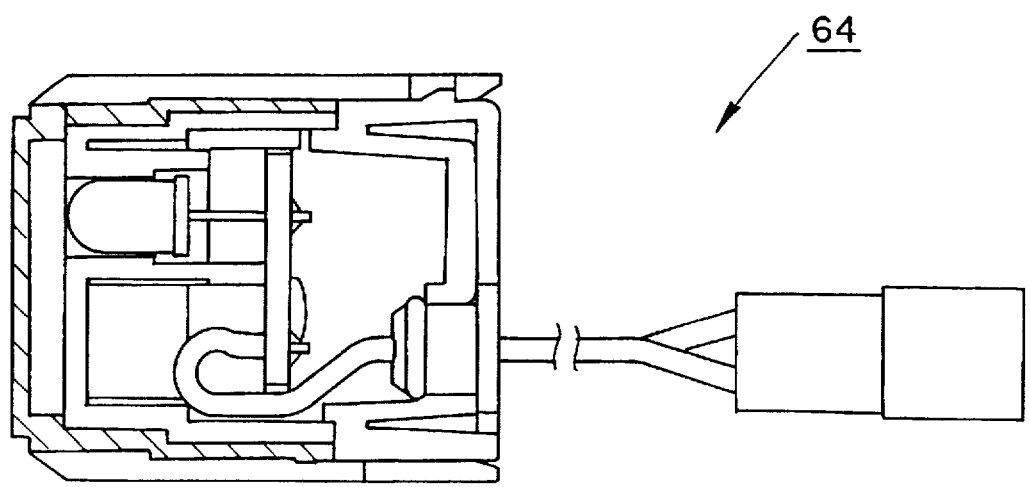
FIG. 8 is an enlarged sectional view taken along the line 8—8 in FIG. 3.
Figure 9:
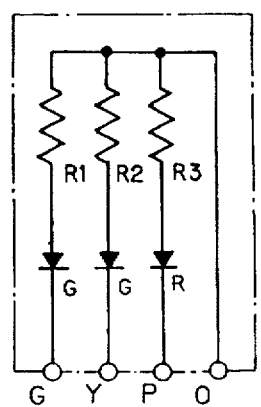
FIG. 9 is a circuit diagram of the residual battery capacity meter.
Figure 12A:
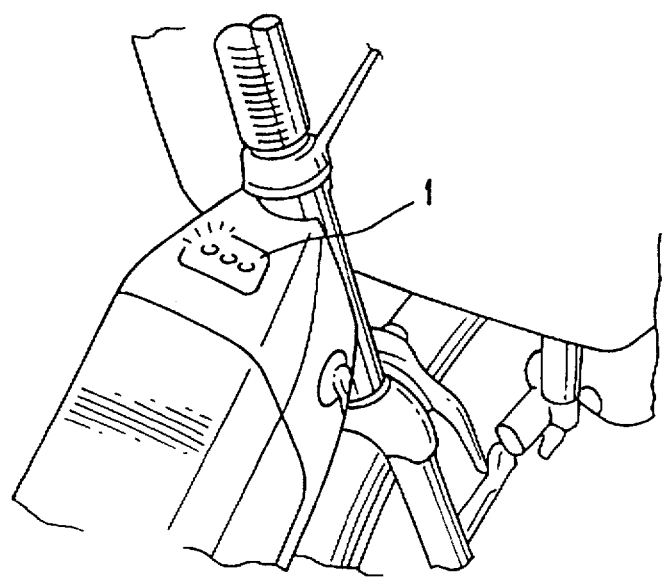
FIG. 12A illustrates the residual battery capacity meter shown in FIG. 11 mounted on an electrically assisted bicycle.

A residual battery capacity meter or display device 64 indicates the residual capacity of the battery unit 52. The meter 64 is centrally mounted on the frame cover 58 at a position between the head pipe 6 and the recess 60 as best shown in FIGS. 2 and 12(A). Further, the meter 64 is flush with the frame cover 58. The residual battery capacity meter 64 has an indicator 66 (FIG. 3) which indicates the residual capacity of the battery unit 52 with at least three different levels. The meter 64 continuously indicates the residual capacity of the battery unit 52 when the bicycle is operated in a power assist control mode i.e., when the driving force of the electric motor is used for auxiliary power.

The indicator 66 indicates the residual capacity of the battery unit 52 with, for example, three different lamps, namely, a first indicating lamp 66-1 to indicate a high residual battery capacity level (H), a second indicating lamp 66-2 to indicate a middle residual battery capacity level (M), and a third indicating lamp 66-3 to indicate a low residual battery capacity level (L).

The residual battery capacity (P) may be calculated in the control unit 50 from the following equation:

$$P = IV + \alpha,$$

where I represents motor current, V represents battery voltage, and $\alpha$ represents a correction value. The value (P) calculated thereby is compared in sequence with predetermined values for each level, i.e., a high residual battery capacity value ($P_H$), medium residual battery capacity value ($P_M$), and low residual battery capacity value ($P_L$), in order to determine the residual capacity of the battery unit 52. After determining the residual capacity of the battery unit 52, the indicator 66, and more specifically, the particular lamp(s) 66-1-66-3 are illuminated to indicate the residual battery capacity.

Figure 10:
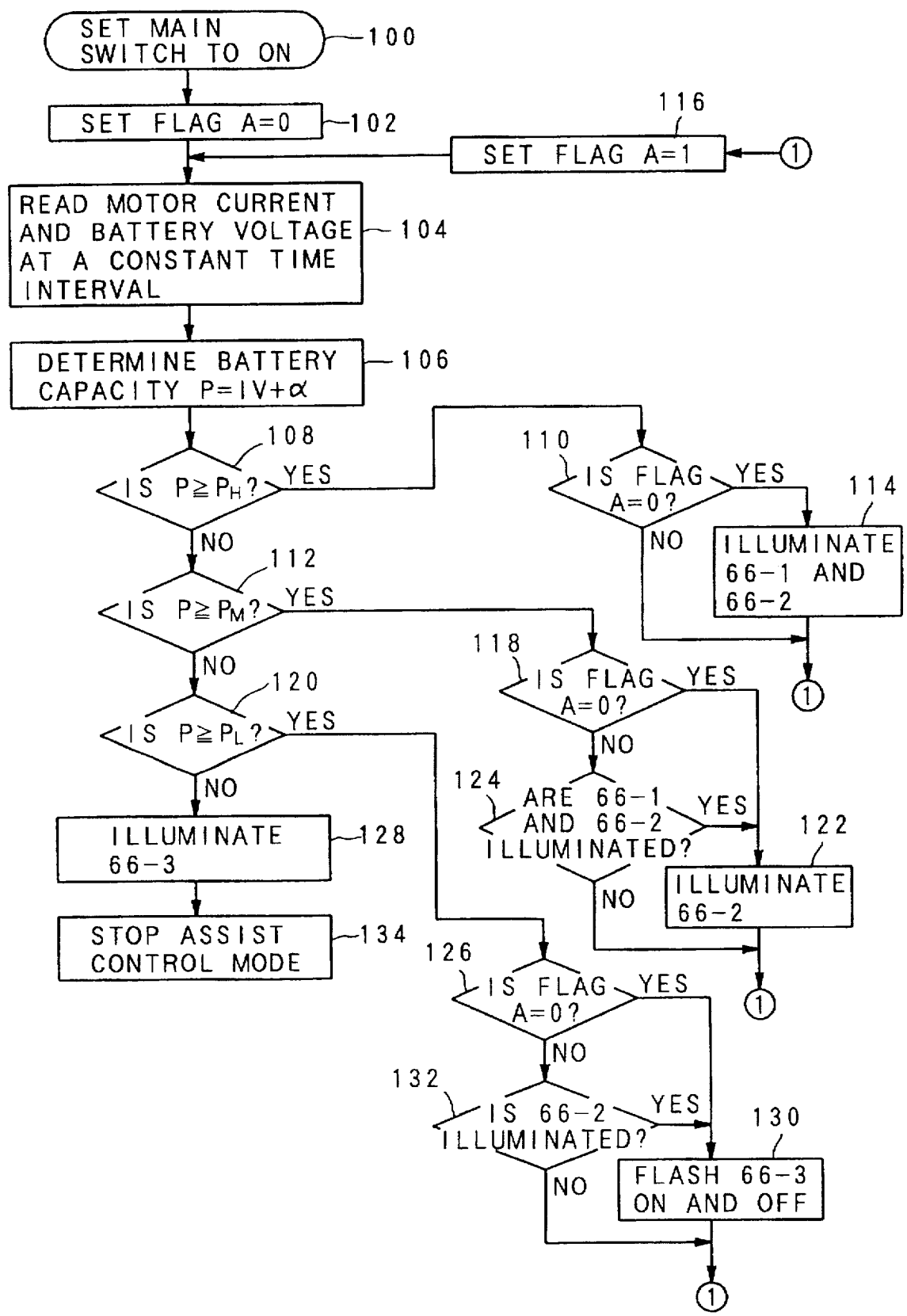
FIG. 10 is an operational flow chart for the residual battery capacity meter.

The operation of the residual battery capacity meter 64 will now be described with reference to an operation flow chart shown in FIG. 10. Turning on the main switch (not shown) of the bicycle 2 starts an operation program 100 which sets a flag A equal to zero (0) in step 102, and reads the motor current (I) and the battery voltage (V) step 104.

The battery capacity (P) is calculated from the following equation: $P=IV+\alpha$ in step 106. In step 108, it is determined whether or not the battery capacity (P) is greater than or equal to the high residual battery capacity value ($P_H$). If the result of step 108 is YES, the routine advances to step 110 to determine whether or not the flag A is set to zero (0). If the result of step 108 is NO, the routine advances to step 112 to determine whether or not the battery capacity (P) is greater than or equal to the medium residual battery capacity value ($P_M$).

In the result of step (110) is YES, the first indicating lamp 66-1 and the second indicating lamp 66-2 are illuminated in step 114. After the flag A is set equal to 1 in step 116, the routine returns to step 104 to read the motor current (I) and the battery voltage (V). If the result of step 110 is NO, the flag A is set equal to 1 in step 116, and the routine returns to step 104 to read the motor current (I) and the battery voltage (V).

In step 112, it is determined whether or not the battery capacity (P) is greater than or equal to the medium residual battery capacity value ($P_M$). If the result of step 112 is YES, the routine advances to step 118 to determine whether or not the flag A is set to zero (0). If the result of step 112 is NO, the routine advances to step 120 to determine whether or not the battery capacity (P) is greater than or equal to the low residual battery capacity value ($P_L$).

In step 118 it is determined whether or not the flag A is set to zero (0). If the result of step 118 is YES, the second indicating lamp 66-2 is illuminated in step 122. After the flag A is set to 1 in step 116, the routine returns to step 104 to read the motor current (I) and the battery voltage (V). If the result of step 118 is NO, the routine advances to step 124 to determine whether or not the first indicating lamp 66-1 and the second indicating lamp 66-2 are illuminated.

If the result of step 124 is YES, the routine advances to step 122 to illuminate only the second indicating part 66-2. If the result of step 124 is NO, after the flag A is set to 1 in step 116, the routine returns to step 104 to read the motor current (I) and the battery voltage (V).

In step 120 it is determined whether or not the battery capacity (P) is greater than or equal to the low residual battery capacity value ($P_L$). If the result of step 120 is YES, the routine advances to step 126 to determine whether or not the flag A is set to zero (0). If the result of step 120 is NO, the third indicating lamp 66-3 is illuminated in step 128.

In step 126 it is determined whether or not the flag A is set to zero (0). If the result of step 126 is YES, the third indicating lamp 66-3 is flashed on and off in step 130. After the flag A is set to 1 in step 116, the routine returns to step 104 to read the motor current (I) and the battery voltage (V). If the result of step 126 is NO, it is determined whether or not the second indicating lamp 66-2 is illuminated.

If the result of step 132 is YES, the routine advances to step 130 to flash on and off only the third indicating lamp 66-3. If the result of step 132 is NO, after the flag A is set to 1 in step 116, the routine returns to step 104 to read the motor current (I) and the battery voltage (V).

In step 120 it is determined whether or not the battery capacity (P) is greater than or equal to the low residual battery capacity value ($P_L$). If the result of step 120 is NO, the routine advances to step 128 to illuminate the third indicating lamp 66-3. After step 128 is completed, an assist control stop process is performed in step 134 wherein the power assist control mode is terminated.

According to the foregoing embodiment, the residual battery capacity meter 64 can be centrally mounted on the frame cover 58 at a position between the head pipe 6 and the recess 60 thereby enhancing the visibility of the residual battery capacity meter 64, and facilitating handling of the same.

In addition, the residual battery capacity meter 64 can indicate the residual capacity of the battery unit 52 with at least three different lamps, namely, the first indicating lamp 66-1 to indicate a high level of residual battery capacity, the second indicating lamp 66-2 to indicate a medium level of residual battery capacity, and a third indicating lamp 66-3 to indicate a low level of residual battery capacity. Therefore, the residual capacity of the battery unit 52 can be expressed in detail and can be precisely determined before operating the bicycle 2. Thus, draining the battery during use of the bicycle can be avoided, and battery recharging can be easily determined.

Further, since at least one of the first indicating lamp 66-1, second indicating lamp 66-2, and third indicating lamp 66-3 is continuously illuminated to indicate the residual capacity of the battery unit 52, any failure of the residual battery capacity meter 64 or battery itself will easily be detected.

The present invention is not limited to the foregoing embodiments, various modifications and changes will be possible. In the foregoing embodiment of the present invention, the indicator of the battery residual meter includes the indicating lamps 66-1, 66-2 and 66-3. However, the indicator 66 may include two or more lamps. Further, the indicator 66 may include a needle for indicating residual battery capacity. In addition, a great variety of displays can be created by the combination of illuminating, flashing and not illuminating the indicator lamps.

FIG. 11 is a block diagram of the residual battery capacity meter or display device 64. The residual battery capacity meter 64 includes a display unit 201 having a plurality of lamps, a residual capacity measurement unit 203 for measuring a residual battery capacity based on a voltage level on a line 209a from a battery 212 of the electric vehicle, and a display controller 202 for controlling the illumination and flashing of the lamps in correspondence with the residual battery capacity measured by the residual capacity measurement unit 203.

The residual capacity measurement unit 203 includes a drive mode measurement module 203B for continuously measuring the residual battery capacity while an electric motor 211 is in a drive mode. The residual capacity measurement unit 203 further includes a stop mode measurement module 203C for measuring the residual battery capacity after a certain period of time passes from the moment the electric motor 211 enters into a stop mode, i.e., the electric motor is stopped. Therefore, an unstable state of the battery voltage immediately after the motor stops can be avoided when measuring the residual capacity, and the residual battery capacity can correctly and stably be measured regardless of the value of the drive current just before the motor stops. The residual capacity measurement unit 203 controls the drive mode measurement module 203B and the stop mode measurement module 203C.

The drive mode measurement module 203B includes a module for measuring the residual battery capacity from a first residual capacity conversion table or map which is based on the battery voltage and the drive current of the electric motor. The stop mode measurement module 203C includes a module for measuring the residual battery capacity from a second residual capacity conversion table which is based on the voltage and temperature of the battery. Thus, while electric motor is in the stop mode, the residual battery capacity is determined based on the relationship between the voltage when the current is zero (0) and the battery temperature. Thus, the residual battery capacity can be measured correctly even when the electric motor is stopped or de-energized.

Figure 15:
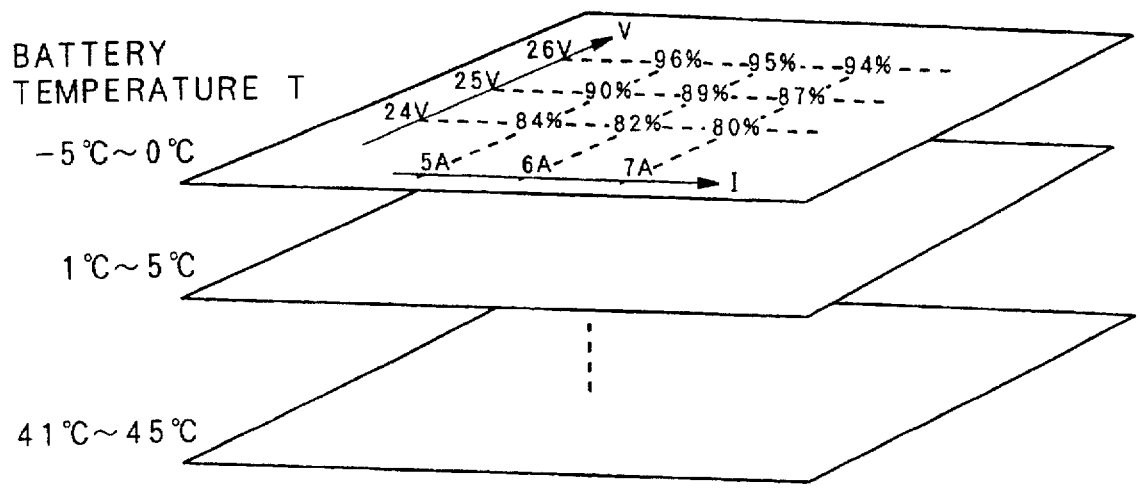
FIG. 15A is an illustration showing one example of a first residual capacity conversion table or map used by a residual capacity measurement unit.
FIG. 15B shows one example of a second residual capacity conversion table or map.
Figure 15:
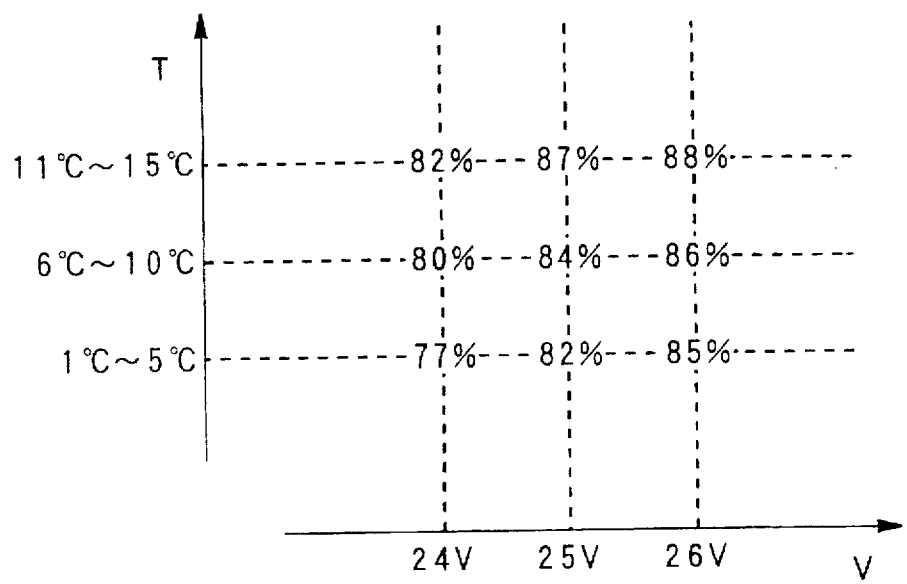

The first residual capacity conversion table includes a plurality of residual capacity conversion tables corresponding to various battery temperature ranges as shown in FIG. 15(A). The drive mode measurement module includes a module for selecting one of the residual capacity conversion tables corresponding to the temperature of the battery. Thus, the residual battery capacity can be determined from battery characteristics (current and voltage) dependent on the temperature change of the battery.

The residual capacity measurement unit 203 includes a module for applying a previously calculated residual battery capacity whereby, when a present residual battery capacity calculated on the basis of the battery voltage is more than a previously calculated residual battery capacity, the previous residual battery capacity is not updated. Since the battery voltage is gradually regained after the load is removed, the measurement of the residual battery capacity is generally greater than a previous measurement. However, since the measurement unit 203 applies the previously calculated residual battery capacity instead of the present residual capacity measurement, the operator is not confused into thinking that the residual battery capacity is increasing.

As shown in FIG. 11, the residual capacity measurement unit 203 is provided with a current measurement module 207 for measuring a current provided on a line 207a, a voltage measurement module 209 for measuring a voltage provided on the line 209a, and a temperature measurement module 213 for measuring a battery temperature provided on a line 213a. These measurement modules measure the operational state of the motor 211 and the battery 212.

Figure 12B:
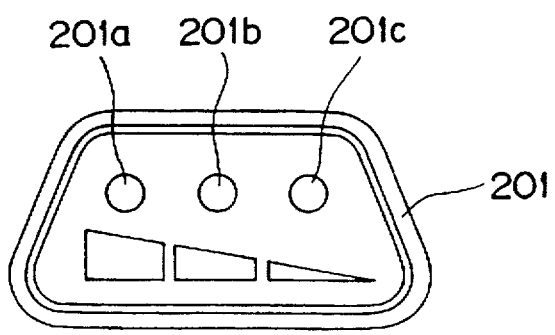
FIG. 12B is front view of the residual battery capacity meter shown in FIG. 12A.

FIGS. 12A and 12B show one example of the display unit 201. As shown in FIG. 12A, the display unit 201 is mounted on the bicycle where the driver of the electrically assisted bicycle can easily view it. As shown in FIG. 12B, the display unit 201 has three lamps (residual capacity display lamps) 201a–201c. In this example, the lamps 201a and 201b are green lamps, and the lamp 201c is a red lamp.

Figures 13, 14:
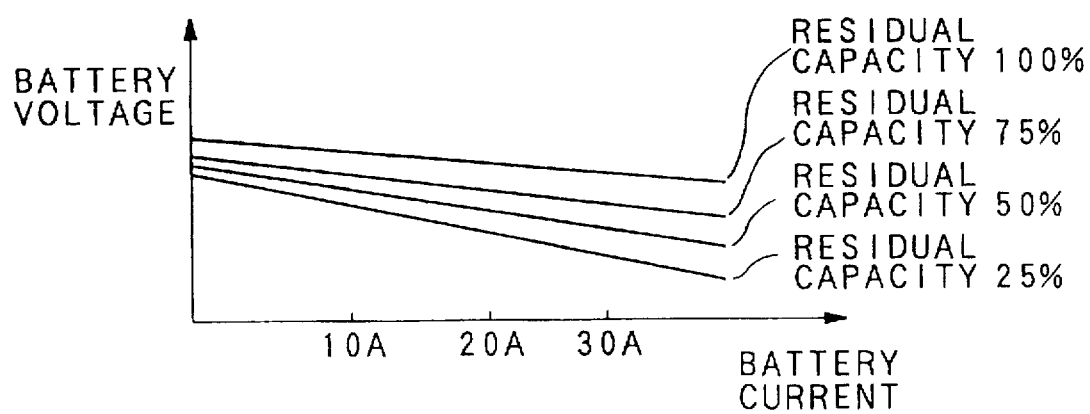
FIG. 13 is a chart illustrating the various display modes of the residual battery capacity meter shown in FIG. 12.
FIG. 14 is a graph showing the characteristics of a storage battery shown in FIG. 11.

FIG. 13 is a chart illustrating an exemplary format for displaying residual battery capacity. As shown in FIG. 13, the display controller 202 controls the illumination and flashing of the lamps in order to display the residual battery capacity. In this example, the lamps 201a and 201b are illuminated when the battery is in a fully charged state, and lamp 201b is only illuminated when the residual battery capacity drops to 50% from a fully charged state. Thus, an operator can easily determine battery consumption corresponding to a load during operation of the electric motor.

FIG. 14 is a graph showing characteristics of a storage battery wherein an internal resistance of the battery increases as the residual battery capacity decreases. Consequently, a voltage drop across the internal resistance of the battery increases as the internal resistance increases. The battery terminal voltage decreases as the residual battery capacity decreases, when the battery current remains the same. The battery voltage under no-load conditions (i.e. no battery current) decreases as the residual battery capacity decreases.

In view of these characteristics of the battery, the described embodiment maps the relationship between the current and the voltage for different levels of the residual battery capacity and stores the maps in a memory 203A. The numeric values illustrated in the described embodiment are exemplary.

Figure 16:
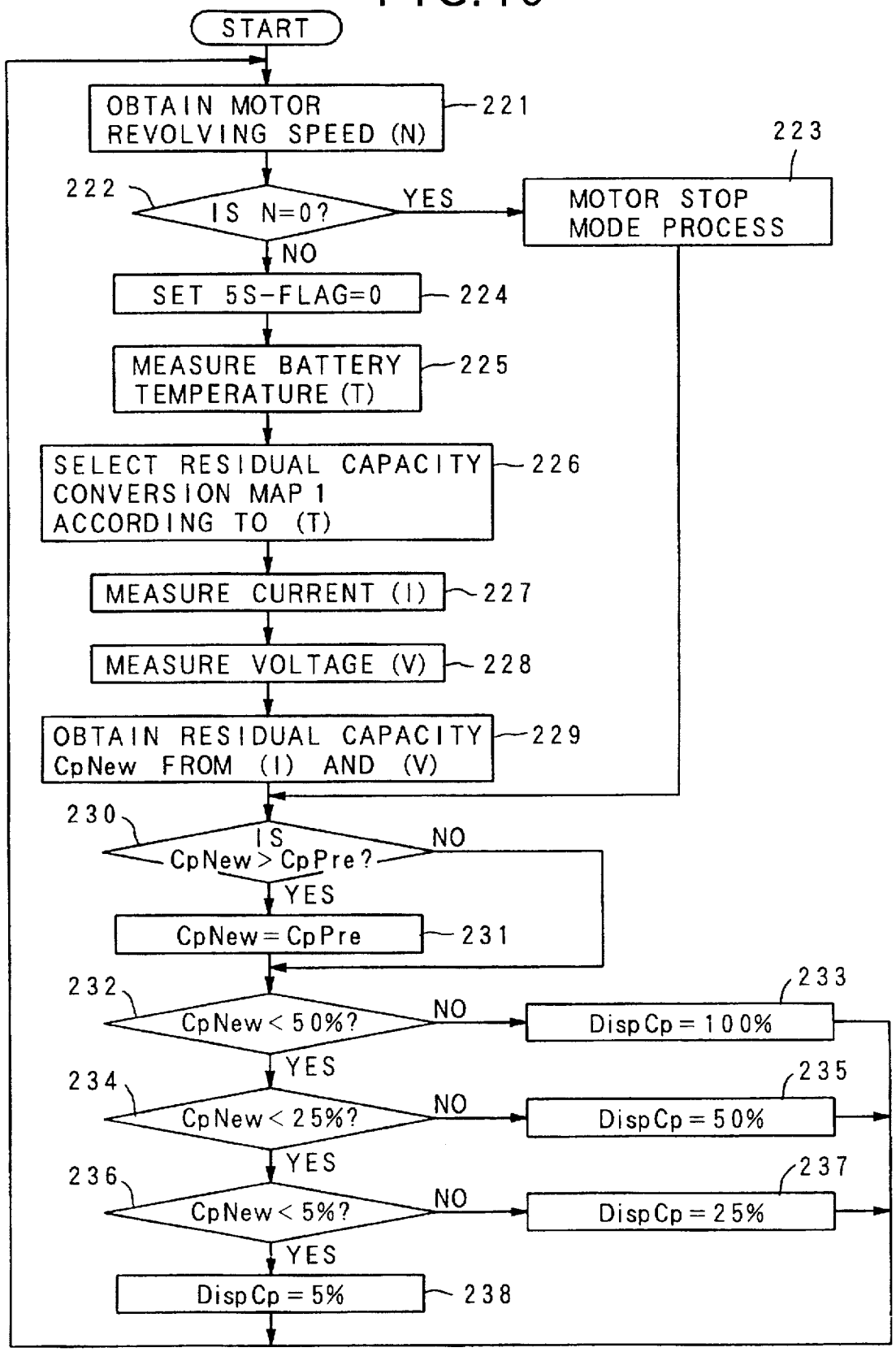
FIG. 16 is an operational flow chart for determining the residual capacity of a battery while an electric motor is operating.

FIG. 16 is an operational flow chart for determining the residual capacity of a battery while an electric motor is operating. First, a motor speed (N) is obtained in step 221. The motor speed is calculated by the motor controller 203 in correspondence with a pedal effort provided by the operator. If it is determined that the motor is stopped (i.e. N=0) in step 222, a motor stop mode process is performed in step 223.

If the motor speed (N) is not zero (i.e. N≠0), a 5s-flag for counting five seconds is cleared in step 224. The 5s-flag is used to prohibit the measurement of the residual battery capacity within 5 seconds after the motor stops. If the motor speed (N) is not zero, the stop mode measurement module 203C does not measure the residual battery capacity, and the 5s-flag is cleared.

Next, a battery temperature (T) is measured in step 225. In step 226, a first residual capacity conversion map shown in FIG. 15A is selected based on the battery temperature (T) measured in step 225. Next, a current (I) and a voltage (V) are measured in steps 227 and 228, respectively. Based on the current (I) and the voltage (V), a new residual battery capacity (CpNew) is obtained from the selected map in step 229. If there are no corresponding values on the selected map, the residual battery capacity is obtained by interpolation using the values close to the measured values.

Next, the previously measured residual battery capacity (CpPre) is compared with the new residual battery capacity (CpNew) in step 230. Step 230 prevents operator confusion by not updating the display when the residual battery capacity recovers (increases). That is, if the new residual battery capacity (CpNew) is greater than the previously measured residual battery capacity (CpPre), the new residual battery capacity (CpNew) is set equal to the previously measured residual battery capacity (CpPre) in step 231.

Display patterns for the residual battery capacity are selected according to predetermined residual capacity levels in steps 232–238. The discharge of the battery may be avoided by displaying a residual battery capacity less than the actual value measured by the residual capacity measurement unit 203. For example, when the residual battery capacity reaches 60% at step 232, the residual battery capacity display may be designed to display 50% at the step 235 instead of 100% at step 233.

Figure 17:
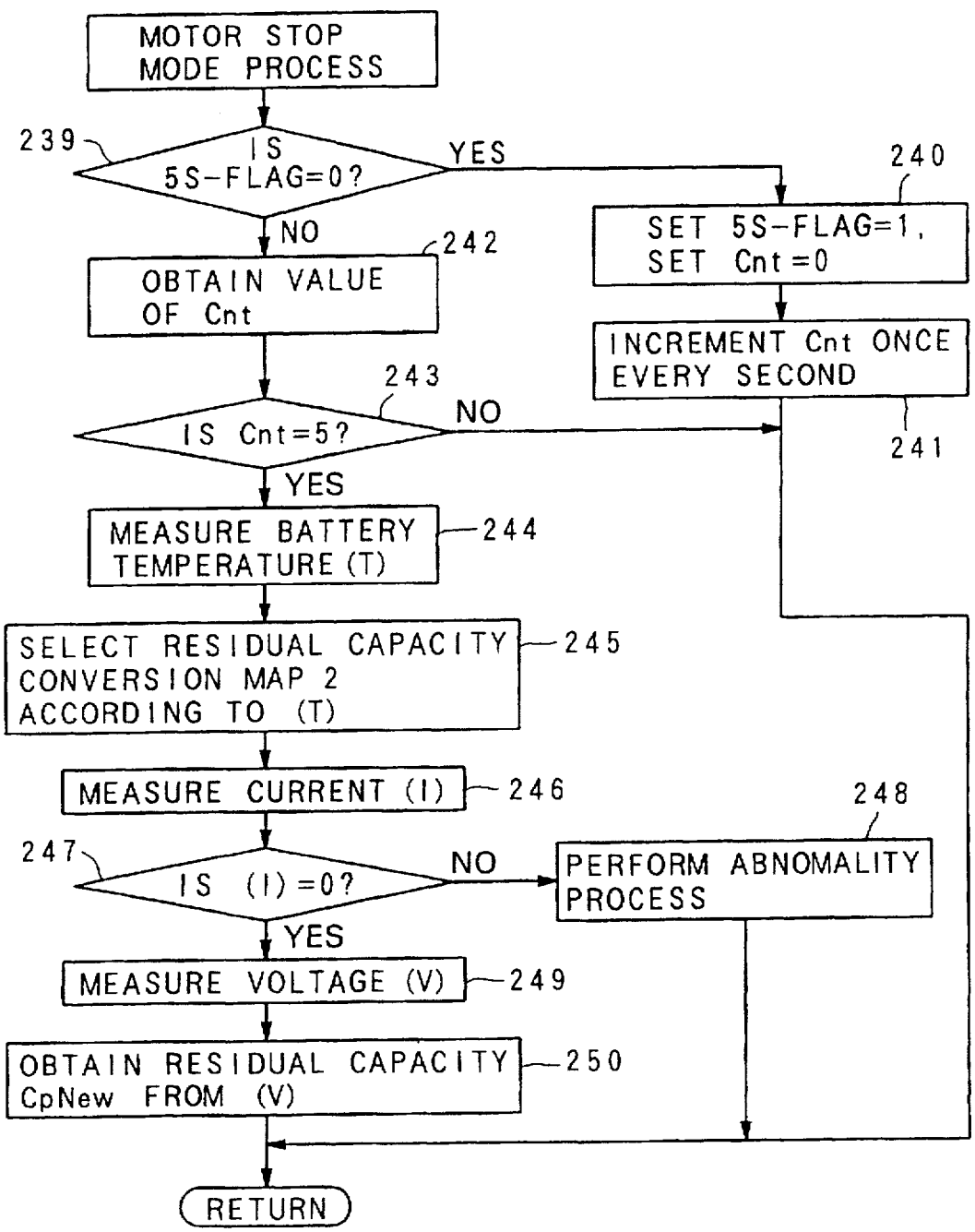
FIG. 17 is an operational flow chart for determining the residual capacity of a battery while the electric motor is not operating.

FIG. 17 is an operational flow chart for determining the residual capacity of a battery while the electric motor is not operating (step 223). When the motor is stopped, the residual battery capacity is measured after a predetermined period of time (herein, five seconds) elapses after the motor is stopped. First, if a 5s-flag is set to zero (0) in step 239, the 5s-flag is set to one (1) and a count value (Cnt) is set to zero (0) in step 240. The Cnt value is incremented once every second in step 241.

While the Cnt value is being incremented in step 241, the routine returns to step 221 (FIG. 16) to confirm whether the motor speed (N) is zero (e.g. the motor is stopped. If the motor speed (N) remains at zero (0), routine advances to step 239, to step 242 to obtain the current value of the Cnt value, and then to step 243 to determine if the Cnt value is set to five. If the result of step 243 is NO, the routine will loop back through steps 221, 239, 242 and 243 until the Cnt value is set to five. If the result of step 243 is YES, it is assumed that the battery voltage has stabilized to the extent that the residual battery capacity can now be stably measured. The battery temperature (T) is measured in step 244. A second residual capacity conversion table or map corresponding to the battery temperature (T) measured in step 244 is selected from the maps shown in FIG. 15B in step 245.

The current (I) is measured in step 246. If the current (I) is not zero (0) (i.e. I≠0) when the motor is stopped, an abnormality is determined to exist in step 247. Therefore, a predetermined abnormality routine is executed in step 248, and the residual battery capacity is not measured. The abnormality routine may include displaying an abnormality warning on the display unit 201.

If the current (I) is zero (0) (i.e. I=0), the voltage is measured in step 249. In step 250, the residual battery capacity is determined by applying the voltage (V) measured in step 249 and the battery temperature (T) measured in step 244 to the second residual capacity conversion table selected in step 245.

According to the present embodiment, since the operator is continuously informed of the charged state of the battery by viewing the three indicator lamps, the operator is able to detect a failure in charging the battery, an abnormality of the battery, and a problem with a battery charging system. Further, since it easy to determine when and how fast the residual battery capacity is decreasing, a potential driving time can be estimated and the battery discharging on a return route can be avoided. In addition, the operator will be able to determine from a driving plan, the points at which the battery should be recharged.

Since the measurement of the residual battery capacity can be accomplished in a drive mode and a stop mode of the electric motor, the use of different residual capacity conversion maps results in a very accurate determination of residual battery capacity when compared to a conventional residual battery capacity measurement process.

In sum, the present embodiment provides a residual capacity measurement unit which utilizes a drive mode measurement module and a stop mode measurement module to determine residual battery capacity depending on whether the electric motor is in a drive mode or a stop mode. Further the stop mode measurement module measures the residual battery capacity after a certain period of time passes from the moment the electric motor enters into the stop mode. Therefore, an unstable state of the battery voltage immediately after the motor stops can be avoided. Thus, the residual battery capacity can correctly and stably be measured regardless of the value of the drive current just before the motor stops, which provides an improved residual battery capacity display device for electric vehicles when compared to conventional devices.

Figure 18:
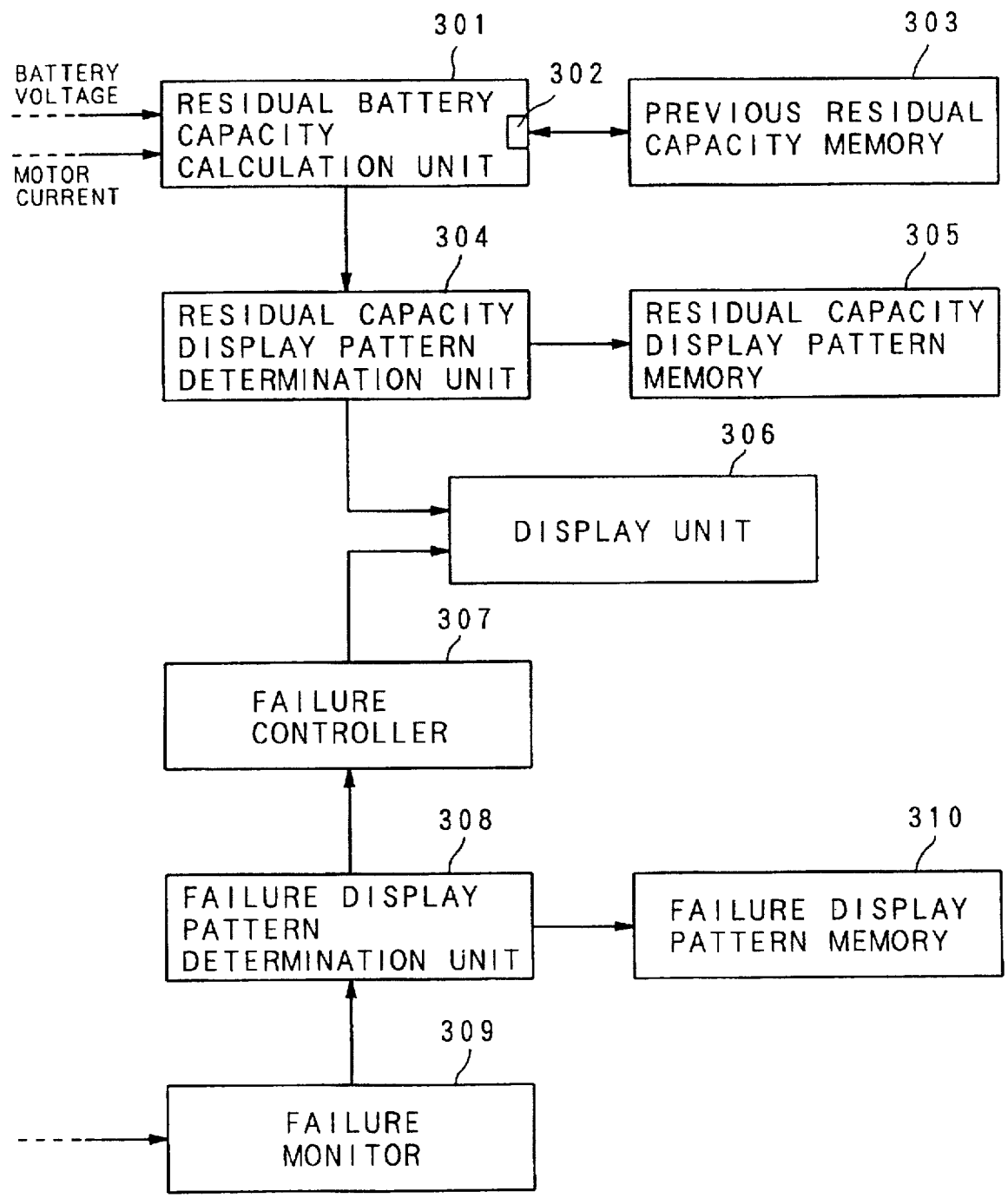
FIG. 18 is a block diagram showing the construction of another embodiment of the present invention.

FIG. 18 is a block diagram showing a third embodiment of the residual battery capacity meter 64. The residual battery capacity meter 64 includes a residual battery capacity calculation unit 301 for calculating a residual battery capacity based on a battery voltage of and a current running through an electric motor 312 (FIG. 19), a residual capacity display pattern specifying unit 304 for specifying a residual capacity display pattern based on the residual battery capacity calculated by the residual battery capacity calculation unit 301, and a display unit 306 for displaying the residual battery capacity based on the residual capacity display pattern specified by the residual capacity display pattern specifying unit 304.

Further, the residual battery capacity calculation unit 301 includes a previously calculated residual capacity module 302 whereby, when the residual battery capacity calculated by the residual battery capacity calculation unit 301 is greater than the previously calculated residual battery capacity, the previously calculated residual battery capacity is sent to the residual capacity display pattern specifying unit 304.

The previously calculated residual capacity module 302 uses a previous calculated residual capacity memory 303 for storing the residual battery capacity calculated by the battery residual capacity calculation unit 201. Since the battery voltage gradually recovers after the load is removed, the residual battery capacity is usually higher than a previous measurement. As previously mentioned, the previously calculated residual capacity is used in place of the presently calculated residual battery capacity in order to avoid operator confusion.

The residual capacity display pattern specifying unit 304 includes a residual capacity pattern memory 305 for storing residual capacity display patterns. The residual capacity display pattern specifying unit 304 retrieves a particular residual capacity display pattern corresponding to the residual battery capacity calculated by the residual battery capacity calculation unit 301, from the residual capacity display pattern memory 305 for display on the display unit 306.

A failure monitor 309 is provided for monitoring the occurrence of a failure associated with the electrically assisted vehicle. A failure display pattern specifying unit 308 is provided for specifying a failure display pattern based on a particular failure detected by the failure monitor 309. A failure display controller 307 is provided for displaying the failure display pattern over the residual battery capacity display when the failure monitor 309 detects the occurrence of a failure.

Figure 19:
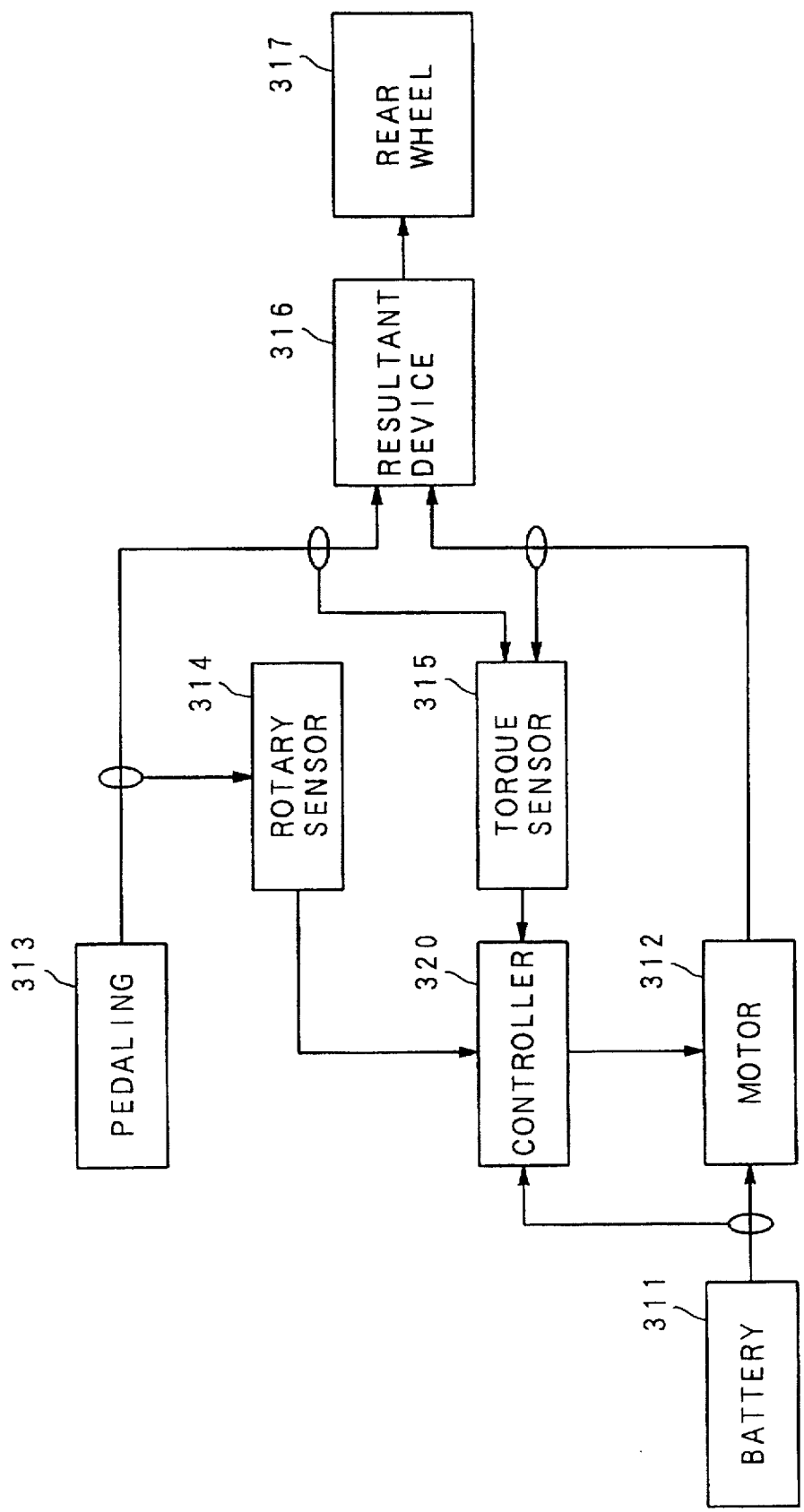
FIG. 19 is a schematic block diagram of an exemplary electrically-assisted bicycle.

FIG. 19 is a simplified block diagram of an electrically assisted bicycle. The electrically assisted bicycle drives a rear wheel 317 by combining in the resultant force device 316, a pedal propelling force 313 generated by pedaling the bicycle and an auxiliary power generated by the motor 312. The pedal propelling force 313 is detected by a torque sensor 315. In particular, the torque sensor 315 detects a difference between an input torque from pedaling and an assist torque from the motor 312 as a relative torque. A controller 320 controls a motor current (assist torque) for driving the motor 312 so that the relative torque is basically zero (0), i.e., the ratio of the input and the assist torque is 1.

Figures 20, 21:
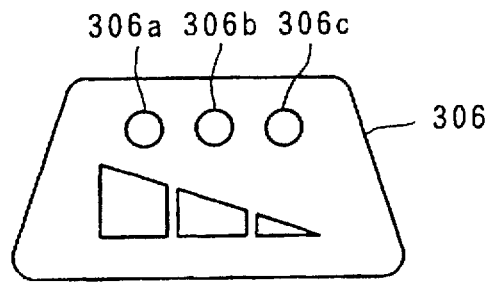
FIG. 20 is a front view of the meter or display unit.
FIG. 21 is a chart showing the relationship between a residual battery capacity and a residual capacity display pattern.

FIG. 20 illustrates one example of the display unit 306. In the present embodiment, three lamps 306a–306c such as LEDs are used for displaying a residual battery capacity. Generally, the residual battery capacity is displayed by various combinations of illuminating and flashing the lamps 306a–306c as shown in FIG. 21. In the described embodiment, the residual battery capacity is displayed by means of illuminating or flashing the residual capacity display LEDs 306a–306c when a battery voltage is below a specified value VBAD after five seconds from when the a main switch is turned on and the motor is turned off (i.e. a duty cycle of zero), or when the battery voltage is below the specified value VBAD for more than three seconds while the motor is on and a motor current IBAD is below a determined amount such as 20 amps.

When the battery system fails, the display is the same as when the residual battery capacity is determined to be below 10%. Further, the battery voltage gradually recovers as the time passes after the load is removed. However in the present embodiment, in order to avoid operator confusion, the residual capacity display is not updated until the main switch is turned off. When the battery capacity is below 10%, a mode shift to an ultra-low power consumption mode is delayed so as to continue illuminating the LEDs for at least five seconds by extending the off-time of a 15 volt system power supply.

Figures 22, 23:
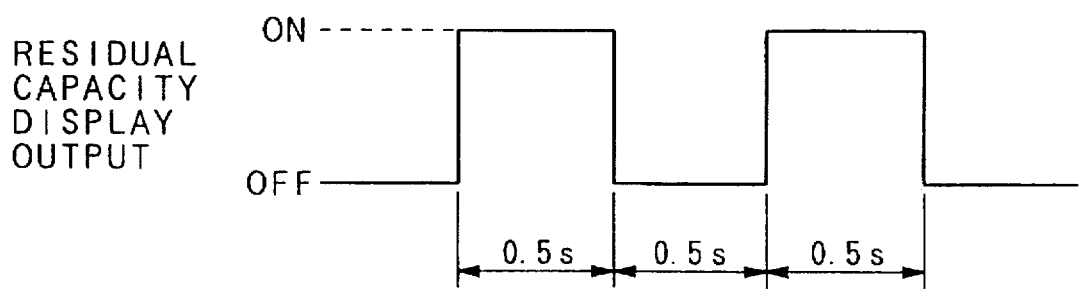
FIG. 22 is a chart showing the relationship among motor current, battery voltage, and residual battery capacity.
FIG. 23 is a chart showing the timing for flashing a lamp to indicate residual battery capacity.

FIG. 22 illustrates one example of a determination map for a residual battery capacity. As shown in FIG. 22, the residual battery capacity calculation unit 301 calculates a residual battery capacity from a present battery voltage corresponding to a present motor current. For example, if the battery voltage is 26.1V when the motor current is 15A, the residual battery capacity is determined to be below 32.5% when the battery temperature is at a temperature of 10° C. If the battery voltage is 28.3V when the motor current is zero amps, auxiliary power is not provided because the residual battery capacity is determined to be below 10%. When the battery voltage and motor current have intermediate values, an interpolation process is performed on the basis of the table shown in FIG. 22.

According to the residual battery capacity calculated by the battery capacity determination map shown in FIG. 22, the residual battery capacity display pattern specifying unit 304 reads out a residual capacity display pattern from the residual capacity display pattern memory 305, specifies a display pattern as shown in FIG. 21, and illuminates and/or flickers the lamps, 306a–306c as shown in FIG. 21. A lamp flashing duty cycle for displaying a residual battery capacity is shown in FIG. 23.

Figures 25, 26:
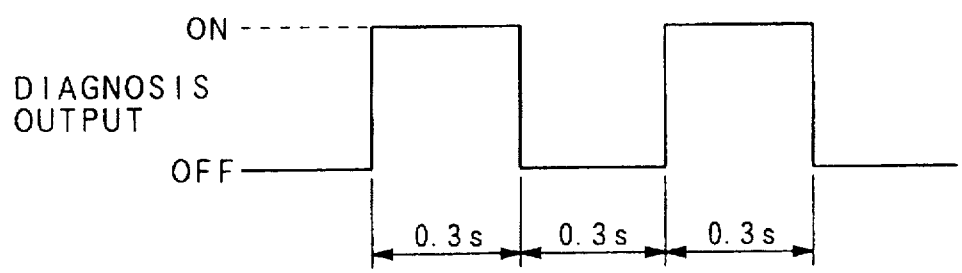
FIG. 25 is a chart showing the relationship between a failure diagnosis code and a failure display pattern shown in FIG. 24.
FIG. 26 is a chart showing the timing for flashing a lamp to indicate a failure diagnosis code.

The failure monitor 309 (1) detects the system abnormalities shown in FIG. 24, (2) stops an auxiliary power assist mode by a fail-safe feature, (3) stops the residual battery capacity display when a system failure is detected, (4) converts a code number indicating the system failure into a binary number, and (5) displays the failure by flashing the lamps as shown in FIG. 25. If a battery voltage below 28.3V continues for 1 sec when a fail-safe relay is on and the motor 312 is off, it is determined to be a failure of the battery system. If the output voltage of the torque sensor 315 exceeds a specified value when the rotary sensor 314 detects that the pedals are stopped, or pedaled in a reverse direction, it is determined to be a failure of the torque sensor system.

If a failure (except a battery system failure) specified in FIG. 24 occurs, the residual battery capacity display is suspended, the code number indicative of the failure is converted into a binary number, and the failure is displayed by the residual battery capacity display LEDs as shown in FIG. 25. If more than two failures occur simultaneously, the first detected failure alone is displayed. If the microcomputer (CPU) in the failure display controller 307 malfunctions, all of the LEDs are turned off.

In the foregoing example, the LEDs are compatibly used in the display for the residual battery capacity and the failure display. However, the display technique is not limited to this example and when several lamps are utilized, the failure diagnosis can be displayed using the lamps and the level of failure diagnosis can be displayed more in detail as the number of the lamps increases.

Further, the flashing duty cycle of the lamps in the failure diagnosis mode is faster than in the residual battery capacity display mode in order to distinguish from the residual battery capacity display, as shown in FIG. 26. If a failure occurs while operating the bicycle, the operator will be provided with an indication of the failure by displaying the failure display. The failure display is sufficiently distinguished from the residual battery capacity display such that operators and service personnel can easily determine what the failure is. Further, since an operator can easily memorize which lamps are flashing when a failure occurs, the operator can inform service personnel so that the failure can be quickly diagnosed and repaired. The failure code number is converted into a binary number which is displayed using several lamps, facilitating discrimination of the failure content.

Figure 27:
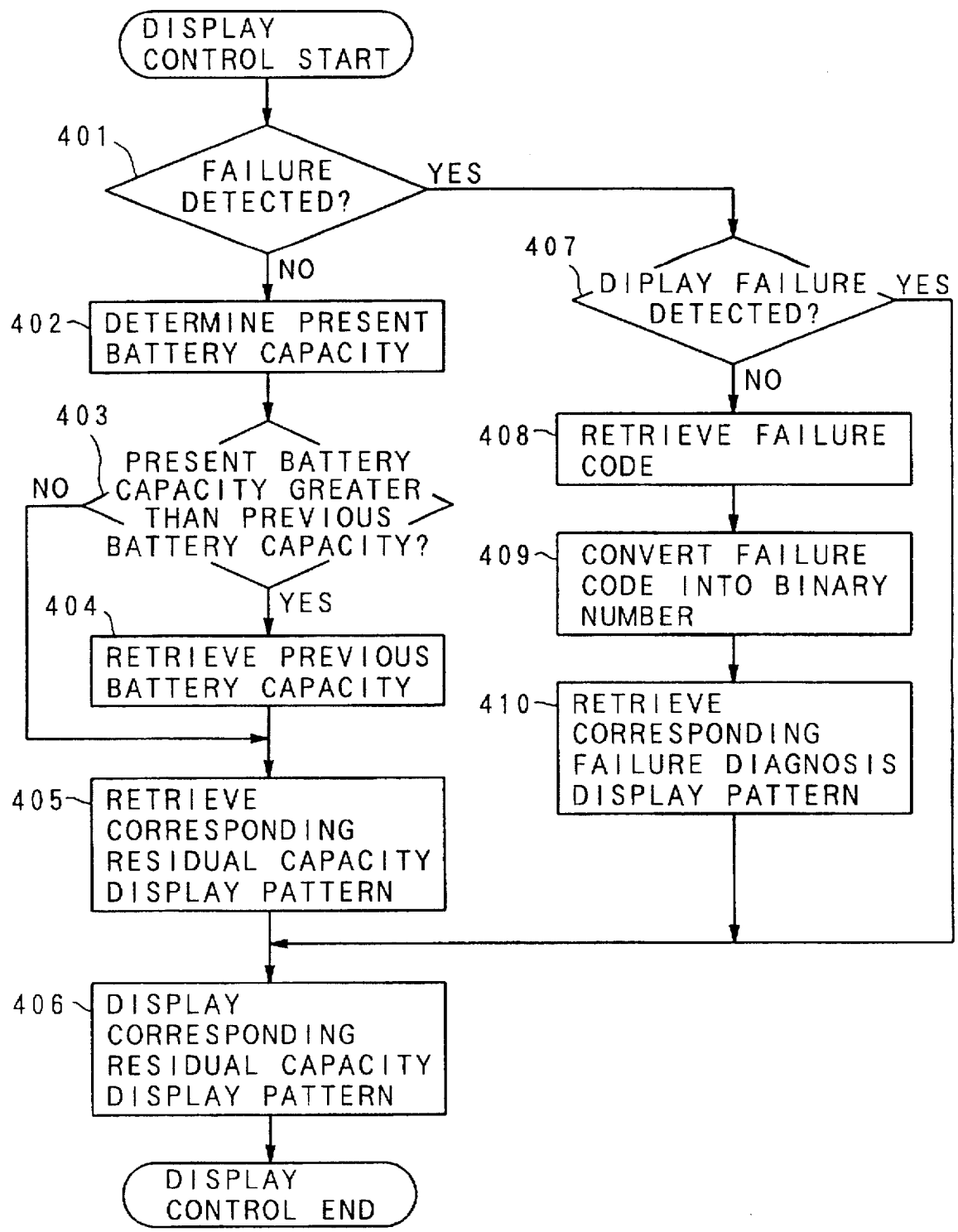
FIG. 27 is a flow chart showing a process for displaying residual battery capacity and failure diagnosis codes.
Figure 28:
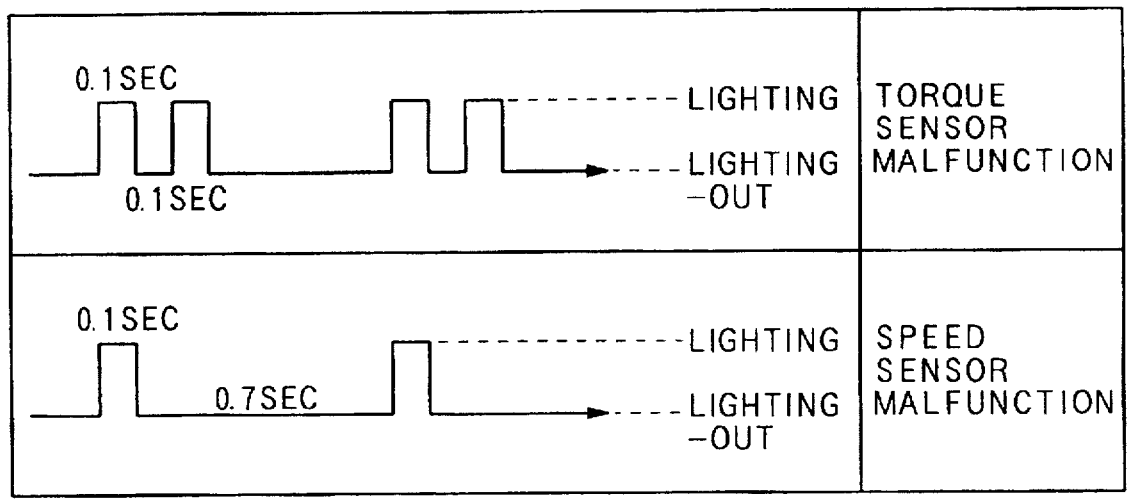
FIG. 28 is a time chart showing a conventional display.
Figure 29:
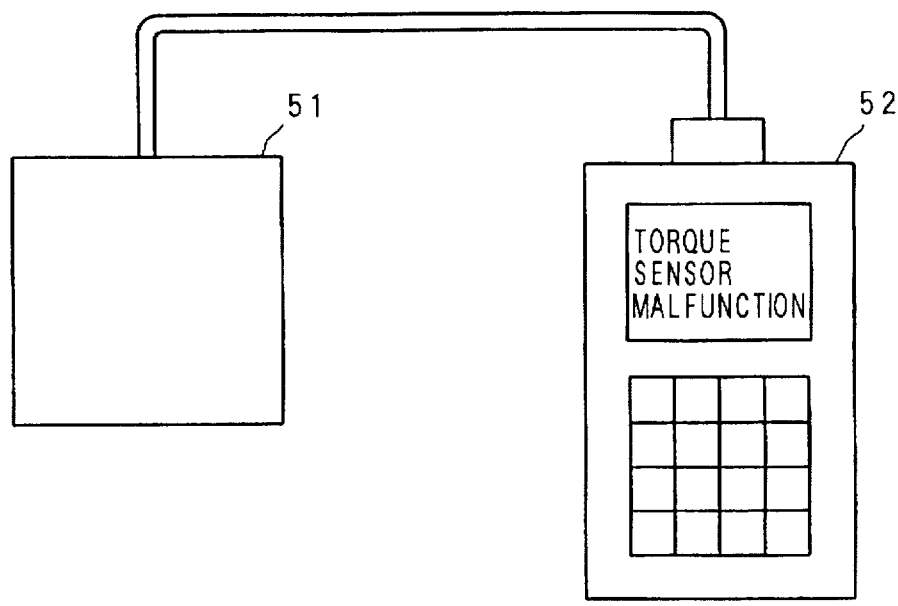
FIG. 29 is an illustration showing one example of conventional failure diagnosis device.

FIG. 27 is a flow chart showing a process for displaying residual battery capacity and failure diagnosis codes. The occurrence of a failure is determined in step 401. If no failure is detected, the routine displays the residual battery capacity in steps 402–406. If a failure is detected, the routine displays a failure code in steps 407–410.

In step 402, a battery voltage is determined and a residual battery capacity is calculated on the basis of the battery voltage. Since the battery voltage gradually recovers after the load is removed, the previously determined battery capacity is used when the presently calculated residual battery capacity is greater than the previously calculated residual battery capacity in steps 403 and 404.

In step 405, a residual capacity display pattern is retrieved on the basis of either the present residual battery capacity selected in step 402, or the previous residual battery capacity selected in step 404. The residual capacity pattern includes a predetermined combination of illuminating and/or flashing the lamps in step 406.

If a failure is determined to exist at step 401, the routine advances to step 407 to determine whether or not a display failure is present. If not, the code for the failure that occurred is retrieved in step 408, and is converted into a binary number in step 409. Next, the flashing cycle of the lamps corresponding to the failure code is retrieved from the failure display pattern memory 310 in step 410. The lamps are then flashed on and off in correspondence with the display pattern in step 406.

According to the present embodiment, a failure can easily be determined from the failure display. The display clearly informs an operator or service personnel of an abnormality. Further, the failure diagnosis display can be made without increasing the cost by combining the residual battery capacity display lamps with existing lamps.

According to the present embodiment, the residual battery capacity calculation unit sends out a previously calculated residual battery capacity value to the residual capacity display pattern specifying unit when the residual battery capacity calculated by the present motor current and battery voltage is larger than the previously calculated residual battery capacity in order to avoid operator confusion. Further, the residual capacity display pattern specifying unit specifies a residual capacity display pattern which specifies which lamp is to be illuminated or flashed and at what flashing cycle.

Thus, the present invention provides a display device for an electrically assisted vehicle wherein the residual battery capacity display and the failure diagnosis display are easy to understand for operators and service personnel.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. A bicycle having an electric motor which provides auxiliary power for driving the bicycle in conjunction with a pedal effort provided by an operator, the bicycle comprising:

a frame having a head pipe communicating with a front wheel of the bicycle, a seat pipe communicating with a saddle, a main pipe communicating with the head pipe and the seat pipe, and seat and chain stays communicating with a rear wheel of the bicycle from the seat and main pipes;

an auxiliary drive unit including an electric motor disposed forward of the chain stay for generating auxiliary power, the auxiliary drive unit also including a crankshaft having cranks provided with foot pedals disposed on opposite sides of the frame;

a battery unit extending downwardly along the main pipe in a longitudinal direction thereof, and a frame cover secured to the main pipe and having a recess for receiving the battery unit therein, the frame cover also covering the auxiliary drive unit; and a residual battery capacity meter for indicating residual capacity of the battery unit, the residual battery capacity meter being centrally mounted on the frame cover at a highest position thereof between the head pipe and the recess.

2. The bicycle set forth in claim 1, wherein the residual battery capacity meter includes an indicator for indicating the residual capacity of the battery unit with at least three lamps, the indicator continuously indicating the residual capacity of the battery unit while the electric motor operates to provide auxiliary power.

3. The bicycle according to claim 1, wherein the residual battery capacity meter includes a display unit which continuously indicates the residual capacity of the battery unit while the electric motor operates to provide auxiliary power.

4. A residual battery capacity display device mounted to an electrically-assisted bicycle which is driven by an electric motor in conjunction with a pedal effort provided by an operator, the residual battery capacity display device comprising:

a display unit having a plurality of lamps;

a residual capacity measurement unit for measuring a residual battery capacity based on a voltage of a battery associated with the bicycle; and a display controller for controlling an illumination and flashing of the plurality of lamps in correspondence with the residual battery capacity measured by the residual capacity measurement unit, wherein the residual capacity measurement unit includes a drive mode measurement module for continuously measuring the residual battery capacity while electric motor is operated, and a stop mode measurement module for measuring the residual battery capacity after a predetermined time period elapses after the electric motor is stopped.

5. The residual battery capacity display device set forth in claim 4, wherein the drive mode measurement module includes means for determining the residual battery capacity from a first residual capacity conversion table based on a battery voltage, and a drive current of the electric motor, and wherein the stop mode measurement module includes means for determining the residual battery capacity from a second residual capacity conversion table based on the battery voltage and a temperature of the battery.

6. The residual battery capacity display device set forth in claim 5, wherein the first residual capacity conversion table includes a plurality of third residual capacity conversion tables each corresponding to a predetermined battery temperature, and the drive mode measurement module further includes means for selecting a third residual capacity conversion table based on the temperature of the battery.

7. The residual battery capacity display device set forth in claim 4, wherein the residual capacity measurement unit includes a previous residual capacity measurement module which causes a previously measured residual battery capacity value to be displayed by the display controller when a present residual battery capacity value is greater than the previously measured residual battery capacity value.

8. A display device for an electrically assisted bicycle which is selectively driven by an electric motor in conjunction with a pedal effort provided by an operator, the display device comprising:

a residual battery capacity calculation unit for calculating a present residual battery capacity value based on a battery voltage and a drive current of the electric motor;

a residual capacity display pattern specifying unit for specifying a residual capacity display pattern based on the present residual battery capacity value calculated by the residual battery capacity calculation unit; and a display unit for displaying the present residual battery capacity value based on the residual capacity display pattern specified by the residual capacity display pattern specifying unit;

the residual battery capacity calculation unit including a previous residual capacity measurement module which causes a previously measured residual battery capacity value to be displayed by the display unit when the present residual battery capacity value is greater than the previously measured residual battery capacity value.

9. The display device set forth in claim 8, further including a failure monitor for detecting a component failure, a failure display pattern specifying unit for specifying a failure display pattern based on the component failure detected by the failure monitor, and a failure display controller for causing the failure display pattern to be displayed on the display unit instead of the residual battery capacity display.

* * * * *